United States Patent [19]

Barrow

[11] Patent Number: 4,560,962

[45] Date of Patent: * Dec. 24, 1985

[54] MULTILAYERED PRINTED CIRCUIT BOARD WITH CONTROLLED 100 OHM IMPEDANCE

[75] Inventor: Michael Barrow, Laguna Hills, Calif.

[73] Assignee: Burroughs Corporation, Detroit, Mich.

[ * ] Notice: The portion of the term of this patent subsequent to Nov. 12, 2002 has been disclaimed.

[21] Appl. No.: 527,840

[22] Filed: Aug. 30, 1983

[51] Int. Cl.⁴ .............................................. H01P 5/12
[52] U.S. Cl. ...................................... 333/1; 174/68.5; 333/238; 361/410
[58] Field of Search ...................... 174/36, 68.5; 333/1, 333/236, 238, 246; 361/410, 414

[56] References Cited

U.S. PATENT DOCUMENTS 4,047,132  9/1977  Krajewski ........................... 333/238
4,434,321  2/1984  Betts ............................... 361/414 X Primary Examiner—Paul Gensler
Attorney, Agent, or Firm—Alfred W. Kozak; Nathan Cass; Kevin R. Peterson

[57] ABSTRACT

A printed circuit board of six planar layers has the layers separated by a dielectric of epoxy glass. The two central layer planes form a ground plane and a voltage plane. The two external planes and the internal planes involve series of microstrip signal lines of specially calculated widths and dielectric separations to provide an essentially 100 ohm characteristic impedance for the signal lines in reference to the ground and voltage planes.

2 Claims, 7 Drawing Figures

MULTILAYERED PRINTED CIRCUIT BOARD WITH CONTROLLED 100 OHM IMPEDANCE

BACKGROUND OF THE INVENTION

This invention involves improvements in printed circuit boards and relates specifically to those types of printed circuit boards which bear multiple conductor arrays.

With the constant trend toward miniaturization of electronic components and especially the use of integrated circuitry and integrated circuit chip components which are mounted on printed circuit boards, there is a constant trend toward finding methods of increasing the density of components while minimizing the amount of real estate or printed circuit board area involved both in length, width and also thickness.

There is increasingly a trend toward the use of multilayer printed circuit boards whereby conductive material is separated by insulative material and several layers of such materials are interleaved in order to provide multiple capabilities of interconnection between the electronic components which are mounted on the outer area of the printed circuit board.

By the use of plated-through apertures or "vias", it is possible to interconnect various of the conductive materials on the different layers of the printed circuit board and at the same time, when necessary, provide insulation when the interconnected elements must not contact a certain layer of the interpenetrating via or aperture.

Accordingly, such patents as U.S. Pat. No. 4,362,899 entitled "Printed Circuit Board" indicates types of elements of the construction of multilayered conductive material separated by layers of insulating material and the use of "plated-through holes". Mention here is also made of a ground plane whereby certain shield tracks are connected to the ground plane to provide shielding.

Similarly, U.S. Pat. No. 4,328,531 entitled "Thick Film Multilayer Substrate" involves a technique of construction of multiple conductor layers with dielectric layers interleaved between them. Here, a power supply line is formed in the conductor layer and is interposed between the first and third conductor layers.

It has been found desirable in the design of high density printed circuit boards, which involve the mounting of multiple components, to provide not only voltage and ground connections to various of the electronic components mounted thereon, but it is also necessary to provide interleaved conductive layers to provide connections between various components with each other, and various components with the voltage plane and the ground plane. Further, in order to minimize signal distortion of pulses or waves traveling in the printed circuit conductors, it is most desirable to maintain a constant impedance between various conductors referenced to the voltage plane and ground plane.

To this end, the present disclosure indicates the development of a high density element storage capability on a printed circuit board involving a plurality of conductive layers which may involve up to six conductive layers separated by insulating substrate and wherein there is provided a constant impedance parameter of 100 ohms plus or minus 10% between any conductive line and the voltage plane and between any conductive line and the ground plane of the printed circuit board. This impedance level is a standard requirement for Transistor-Transistor Type (TTL) logic. In addition, there is a standard constraint thickness of printed circuit boards which requires overall thickness of 0.062±0.007 inch (7 mils). Thus, the overall thickness of the printed circuit board may be permitted up to a maximum of 0.069 inches (69 mils).

CROSS REFERENCES TO RELATED APPLICATIONS

This disclosure is related to a patent application entitled "Printed Circuit Board Maximizing Areas for Component Utilization", inventor Michael Barrow and filed Aug. 30, 1983 as U.S. Ser. No. 527,841.

SUMMARY OF THE INVENTION

It is an object of the present invention to provide a circuit board which provides a multilayered substrate wherein a plurality of conductive layers are separated by the insulating substrate and whereby the characteristic impedance between any metallic conduction signal plane and a voltage plane or a ground plane will be of a constant nature, in this particular case, approximately a constant 100 ohms characteristic impedance.

It is a further object of this invention to configure a multilayered printed circuit board having an internal voltage plane and a ground plane on either side of which there are at least two conductive signal layers, such that the impedance between any signal layer and a voltage plane or any signal layer and a ground plane will always approximate 100 ohms characteristic impedance.

It is a further object of this invention to provide a multilayered printed circuit board which, while using a minimal amount of surface area, will provide for multiple interconnections between electronic components mounted on the component surface of the printed circuit board and also between the voltage plane and the ground plane.

It is a further object of the invention to provide an internal voltage plane and ground plane central to a plurality of conductive signal layers such that there will be no attenuation, alteration or distortion of signals which pass through the signal conductive planes and further there will be minimal cross talk or cross induction from one signal plane to another.

It is a further object of the invention to provide a multilayered circuit board having internal voltage and ground planes and at least four separate signal planes yet the board being restricted to a thickness of only 0.062 of an inch plus or minus 0.007 of an inch.

The above objects are accomplished by using an epoxy glass insulating substrate which separates a parallel series of conductive copper signal planes and which also separates an internal conductive copper voltage plane from an internal conductive copper ground plane. The external top conductive layer and the external bottom conductive layer are eight mil width conductive lines, that is to say 0.008 of an inch. These eight mil conductive lines have a thickness of 1.4 mils. Internally and 0.003 of an inch (3 mils) away from the top and bottom external conducting planes there is another conducting layer having a five mil width which is used for a signal line. Internally at a distance of 0.025 of an inch from the top internal signal line there is a ground plane conductor having a one ounce weight characteristic. (Note: the NEMA, National Electrical Manufacturers Association, manual defines this as the deposition of one ounce of copper deposited evenly on a one square foot area which results in a thickness of 1.4 mils). Then, inward from the lower (solder side) external signal layer there is a voltage plane separated by 0.025 of an inch of substrate. The voltage plane is a conductive layer of one ounce character (1.4 mils thickness) and is separated from the ground plane by 0.005 of an inch of substrate. This minimum separation ensures good voltage to ground noise decoupling.

It is the particular width and thickness and shape of the various signal line planes and the separation distances between the signal planes and the voltage plane (and or ground plane) that make it possible for there to exist a constant impedance of 100 ohms between any signal line and the voltage plane or between any signal line and the ground plane.

It is desirable that a constancy of impedance be established since this will ensure that all signals operating on the signal lines will see the same impedance and no one signal will be changed or distorted disproportionately in relationship to another signal line.

BRIEF DESCRIPTION OF THE DRAWINGS

FIG. 4A shows a cross-section of a signal line for an "external" plane while

DESCRIPTION OF PREFERRED EMBODIMENT

Figure 2:
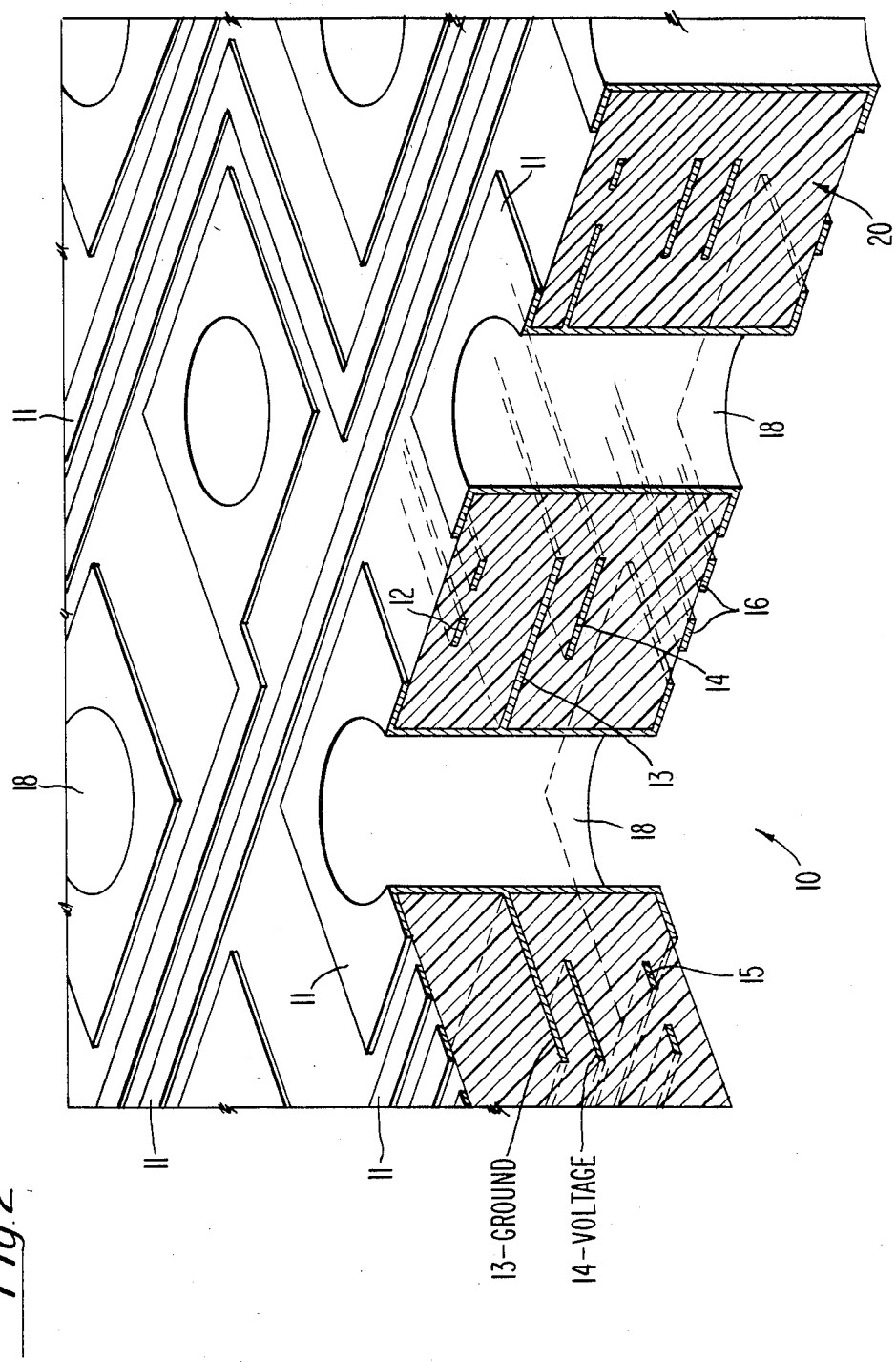
FIG. 2 is an isometric drawing showing a cross-section of the printed circuit board indicating the various conductive planes separated by the substrate and also illustrating examples of plated-through holes whereby it is possible to make electrical connection between various of the inner and outer layers of the multilayered printed circuit board.

FIG. 2 shows a cross-sectional cutout of a portion of a printed circuit board built according to the subject invention. The printed circuit board 10 is shown having a top external layer plane or "component side" layer 11 and the external lower side or "solder side" layer plane 16. Further, there is shown the internal upper signal layer plane 12, the ground plane 13, the voltage plane 14, the internal lower signal layer plane 15 and the external lower signal layer plane 16 (which corresponds to the sixth layer 16 of deposition on the substrate).

The plated-through holes 18 may be used to connect any of the signal planes to the top layer signal plane which holds the components or to the ground plane or voltage plane as may be necessary. Likewise, the hole 18 may not be plated-through, that is it may be insulated so as not to connect, and thus to maintain the insulation as between any two conductive layers.

Figure 3:
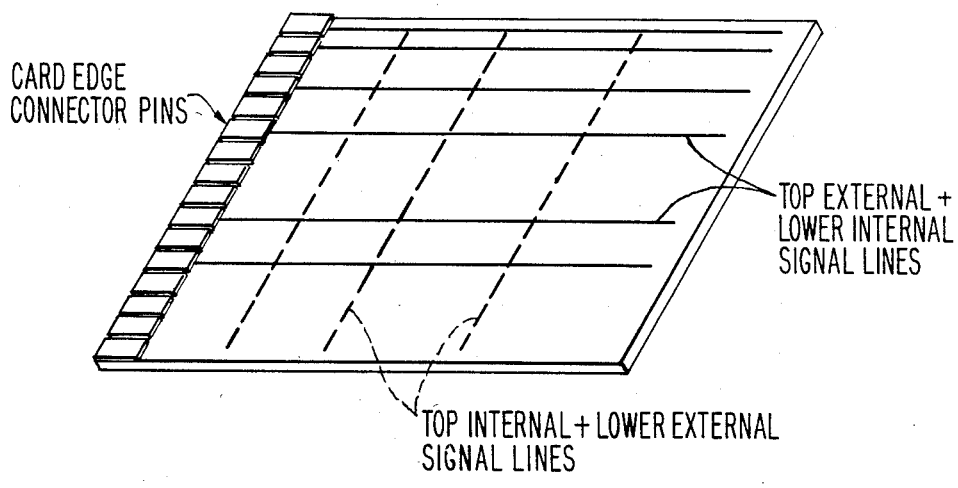
FIG. 3 is a schematic drawing showing the overall printed circuit board with slide-in connector pins at one edge and also the orientation of the various signal lines of different layers.

FIG. 3 shows the printed circuit board in perspective and having slide-in connector pins along one edge. The solid lines illustrate the orientation of the top external and the lower internal signal lines while the broken lines show the top internal and lower external signal lines.

Figure 1:
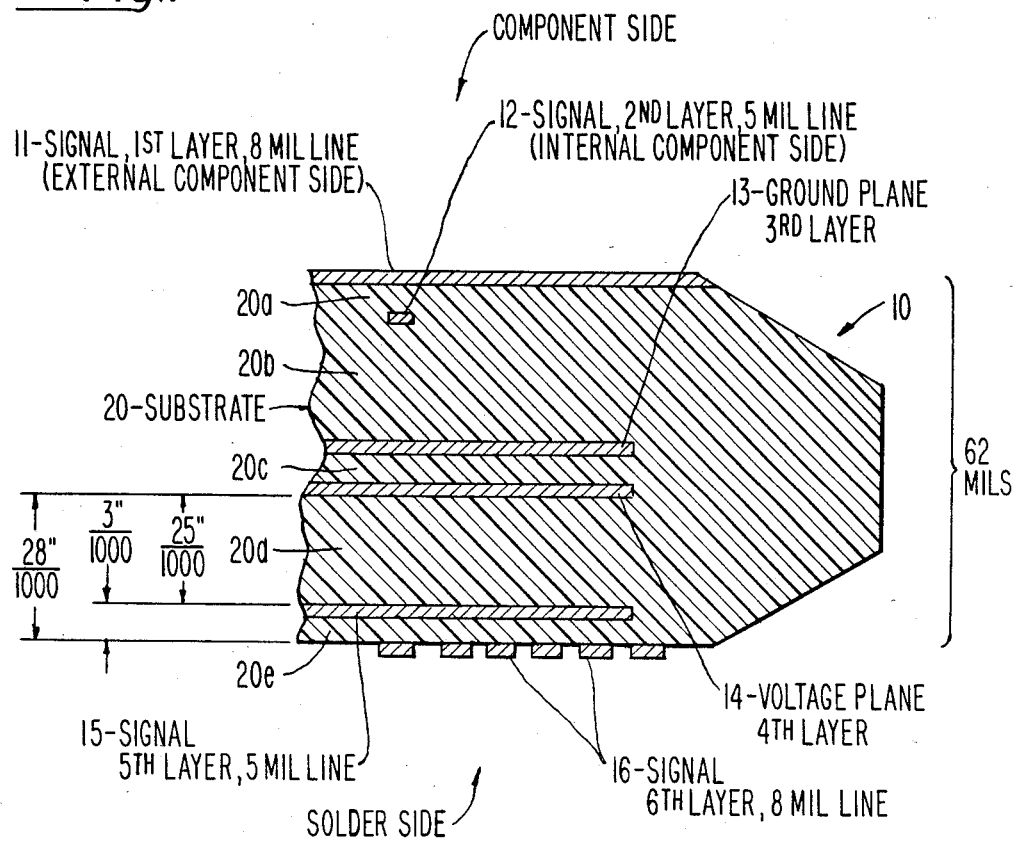
FIG. 1 is an expanded cross-section drawing which shows the multilayered printed circuit board with four signal conducting planes, two at the top at the component side and two at the bottom on the solder side, in addition to the internal voltage plane and conductive ground plane.

Referring to FIG. 1 there is seen a cross-sectional view of the multilayered printed circuit board of the present disclosure. The top or component side is a signal plane 11 having a first layer of conductive copper upon which there may be connected or placed various electronic components. It is important to note that the size of this particular plane is critical to the configuration and thus the first layer is an eight mil width line (or a plurality of such lines) and is designated as a "one ounce weight characteristic", (which means it has a thickness or height of 0.0014 inches or 1.4 mils).

Directly beneath the first signal layer 11 there is a substrate portion $20_a$ having a thickness of 0.003 of an inch (3 mils) after which there is placed another conductive plane 12. This may be called the second signal layer and it is made of five mil width lines (plus or minus one mil) and can be designated as a one-half ounce weight characteristic, thus having a thickness (height) of 0.0007 inches or 0.7 mils. This second signal layer may consist of a plurality of separate signal lines of 5 mil width which run at right angles to the lines of the first signal layer.

Between the second signal layer 12 and the ground plane 13, there is a substrate $20_b$ of thickness equal to 0.025 of an inch (25 mils plus or minus 1.5 mils) after which there is seen the ground plane 13 having a one ounce characteristic or thickness (height) of 1.4 mils.

Separating the ground plane 13 from the voltage plane 14 there is a substrate $20_c$ having a thickness of 0.005 of an inch or 5 mils. The substrate of 5 mils is useful since the standard manufacturing practice is to provide a 5 mil separation between a ground plane and a voltage plane of conductive copper. However, this substrate thickness, normally standard for manufacturing, could be made anywhere from 1 mil to 5 mils in thickness.

The voltage plane 14 may be considered as being the fourth layer from the top or component side while the ground plane 13 could be considered the third layer. The voltage plane 14 is used to carry power, that is voltages and currents which are to be connected to various of the elements mounted on the component side of the printed circuit board 10 of FIG. 1.

Element No. 15 represents the fifth layer from the top and constitutes a plurality of signal lines in a plane wherein each one of the signal lines is "internal" and each line constitutes a five mil width line for carrying signals between various components on the component side which may be connected to the signal lines through the plated-through connectors 18 shown in FIG. 2. The fifth layer 15 represents a series or plurality of signal lines which run basically at right angles to the second signal layer 12 and to the sixth layer 16 of signal lines.

The sixth layer 16 is a set of signal lines which are separated from the fifth layer 15 signal line by the portion of substrate designated $20_e$ which is in the range of 3 mils plus or minus 1.5 mils. The sixth layer is the signal layer 16 and is made of an eight mil width line. A plurality of such 8 mil width lines may constitute the sixth layer as seen as elements 16 of FIG. 1. These lines run at right angles to the lines of the first signal layer 11. This sixth layer represents the solder side where a solder bath may be used to make interconnections at this lower external side.

In order to calculate the impedance (FIG. 4A) between an "external" signal line (microstrip) and ground, or the "external" signal line and the voltage plane, it is required that use be made of the impedance formula:

$$Z_o = \frac{60}{\sqrt{0.475 \times E_r + 0.67}} L_n\left(\frac{5.98 \times C}{0.8 W + t}\right)$$

where
- $E_r$ = dielectric constant for material substrate, for example, epoxy glass = 4.2 to 5.0
- W = width of conductor, in mils
- t = thickness of conductor, in mils
- C = dielectric thickness, in mils
- $L_n$ = natural logarithm.

Figure 4A:
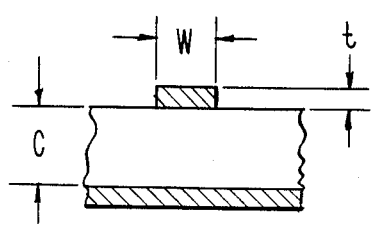
Figure 4B:
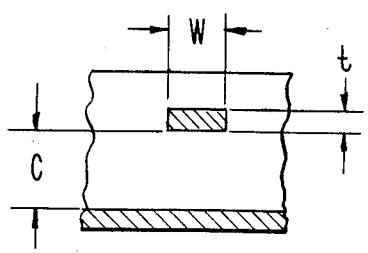
FIG. 4B shows the signal line cross-section for an "internal" plane.

The above formula is derived for a rectangular microstrip having width W and thickness t as seen in FIGS. 4A and 4B. Similar type impedance derivations are performed for circular microstrip in an article entitled "Characteristics of Microstrip Transmission Lines" by H. R. Kaupp published in IEEE Transactions on Electronic Computers, vol. EC-16, No. 2, April 1967 at pages 185–193.

Thus, for an "external" signal line, if the impedance $Z_o$ is plotted on a chart for a line having an 8 mil width (W) and a 1.4 mil thickness, then this would require that the dielectric thickness C (distance between the external signal level plane and the adjacent ground plane or voltage plane) should be approximately 28 mils in order to provide a 100 ohm line impedance.

For the "internal" signal microstrip line (FIG. 4B), the impedance formula is:

$$Z_o = \frac{60}{\sqrt{E_r}} \times L_n\left(\frac{5.98 \times C}{0.8 W + t}\right)$$

Here, if the impedance $Z_o$ is plotted for a line having a 5 mil width and 0.7 mil thickness (one-half ounce characteristic), then the dielectric thickness C (distance between the "internal" signal plane and the adjacent voltage or ground plane) should be approximately 25 mils in order to provide a 100 ohm characteristic impedance.

Another feature of the multilayer printed circuit board is its higher capability for interconnections between the mounted component units through the internal layered lines.

For example, the component side of the printed circuit board may support a variety of integrated circuit chips which have various configurations of output connection pins. These may vary from a 10×10 grid of output connections, or 20 pin output connections, or 28 pin output connections, etc. Thus, the surface of the board must be compatible to permit these type of connections to occur without interference to the conducting lines on the first layer signal plane on the top external component side of the printed circuit board.

The density involved in a printed circuit board design can be expressed as line resolution—i.e., the dimension of the conductor width and the dielectric space. Presently many high density boards are those designed primarily with two conductors routed between holes on 100 mil centers using an 8 mil conductor and an 8 mil dielectric space.

For random logic usage, the required length of conductor needed per unit board area (or the interconnect capacity) of a printed circuit board to connect a given number of I/O pins has been empirically determined and it can be generally expressed by the formula as follows:

$$C_i = M \times N / A$$

Where M is a constant with certain values as follows:
- M = 3.0" per pin for two signal layers
- M = 3.5" per pin for four signal layers
- $C_i$ = interconnect capacity, inches per square inch
- N = number of I/O pins within an area
- A = area available for routing in square inches.

Figure 5:
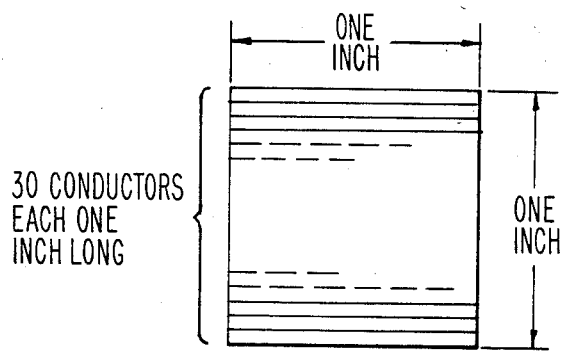
FIG. 5 illustrates a concept involving interconnect capability involving the number of conductors per square inch of surface on the printed circuit board.

The interconnect capacity "$C_i$" for one signal layer using a 16 mil grid is, on the average, 30" per square inch. Thus, if we let the symbol $K_{16} = 30$" per square inch and let $L_y = C_i/K_{16}$ and $L_y$ is the number of layers required to route a given number of pins in a given area. The concept of interconnect capacity, $C_i$, is illustrated in FIG. 5 to show that "30 inches per square inch" means a board area of one square inch having 30 microstrip conductors.

In the particular embodiment of the multilayered printed circuit board described herein there is used what is known as a 100 mil grid for purposes of mounting components on the external surface. For example, in FIG. 2 there are seen two adjacent plated-through conductors 18 which are spaced 100 mils apart for purposes of mounting external components.

Figure 6:
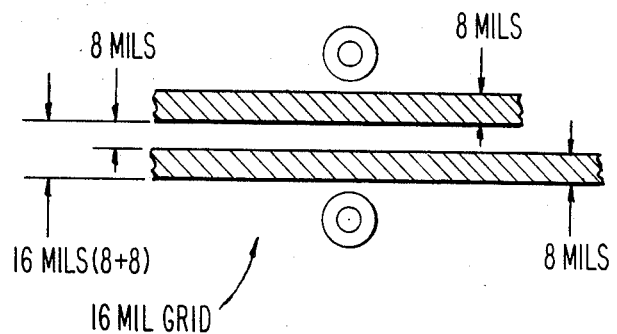
FIG. 6 illustrates a 16 mil grid arrangement.

On the other hand there is used a standard 16 mil grid, as seen in FIG. 6, for purposes of the microstrip signal lines in regard to their pattern of spacing. Thus, as seen in FIG. 6, the 16 mil grid means that when a microstrip line has an 8 mil width, it then has adjacent to it an 8 mil space of substrate. Thus, the 16 mil grid means that there are 8 mils of conductive microstrip line and 8 mils of substrate space before the next microstrip line appears. This 16 mil characteristic grid is used on the external planes 11 and 16 of FIG. 1.

A slightly different configuration occurs on the internal signal planes 12 and 15 of FIG. 1. Here, we still use a "16 mil grid"; however, in this case, the width of the microstrip signal line is 5 mils while the adjacent space is 11 mils, thus the combination of 11 plus 5 giving a 16 mil grid. This was described in connection with the description of FIG. 1. Thus, while the outer signal planes have 8 mil width microstrip conductors, the internal microstrip signal planes have 5 mil width conductors. However, in each case they both form and use a "16 mil grid". Thus, the grid configuration is preserved while at the same time the width of microstrip is altered in order to maintain the appropriate 100 ohm plus or minus 10% characteristic impedance, all the while maintaining a tremendously thin overall dimensional thickness of 62 mils + or −7 mils for the printed circuit board.

Thus, it is possible to determine how many layers $L_y$ are required to route a 68 pin chip carrier on a routing area of 3.4 square inches.

Interconnect Capacity $C_i = 3 \times 68/3.4$
$C_i = 60$ inches per square inch, and
$L_y = 60/30$
$L_y = 2$ layers Thus, "two" signal layers are required to successfully route this chip in the particular area provided. It should be noted that as chips are placed closer together on a printed circuit board, the area for routing is decreased and thus "additional" signal layers must be provided in accordance with the above stated equations.

The table shown below as Table I shows the minimum routing areas required for various packages using a 16 mil grid on both two and four layer signal planes. Reference to FIG. 6 will illustrate the 16 mil grid.

TABLE I

Note: This shows a minimum routine area required for 2 and 4 signal layers with a 16 mil grid (FIG. 6).

| | Pins/Package | | 2 Signal Layers Routing Area In$^2$ | 4 Signal Layers Routing Area In$^2$ | Area Saved | % of Area Saved With 4 Layers Over 2 Layers |
|---|---|---|---|---|---|---|
| Dips | 0.3 in. center line | 14 | 0.70 | 0.40 | 0.30 | 43% |
| | | 16 | 0.80 | 0.47 | 0.33 | 41% |
| | | 18 | 0.90 | 0.53 | 0.37 | 41% |
| | | 20 | 1.00 | 0.58 | 0.42 | 42% |
| | | 24 | 1.20 | 1.04 | 0.16 | 13% |
| | 0.6 in. center line | 28 | 1.40 | 1.12 | 0.28 | 20% |
| | | 40 | 2.00 | 1.68 | 0.32 | 16% |
| Chip Carriers | | 68 | 3.40 | 1.98 | 1.42 | 42% |
| | | 84 | 4.20 | 2.45 | 1.75 | 42% |
| | | 120 | 6.00 | 3.50 | 2.50 | 42% |
| | | 156 | 7.80 | 4.55 | 3.25 | 42% |

To estimate the number of packages a particular board style can accommodate, the total routing area of the packages must be compared to the available routing area on the printed circuit board.

If, for example, it is required to know how many 16-pin "dips" (Dual In-Line Packages) can an electrical interface board accommodate with two signal layers using a 16 mil grid then the following procedure is possible.

Let us say the electrical interface board has 14 square inches of usable routing area. Now according to Table I, it can be seen that 16 pin "dips" require 0.8 square inches of routing area when using two signal layers.

$$\begin{aligned}\text{Number of 16-pin packages} &= \frac{\text{Usable Area on Board}}{\text{Minimum Area Required}} \text{ for 16 Pins} \\ &= \frac{14 \text{ square inches}}{0.8 \text{ square inches}} \\ &= 17.5 \\ &= 18 \text{ approximately}\end{aligned}$$

Thus, a board having 14 square inches of area and two layers of signal planes can accommodate 18 "dips" of 16 pins each.

The limiting factor for board density may not always be the routability (which itself is limited by profile of the package) but also the power density that the board can dissipate in a given environment.

However, using the above data, it is now possible to set design parameters for printed circuit boards to maximize the interconnect capability when knowing the available board area and the type of carrier components to be mounted on the printed circuit board.

There has thus been described a multilayer printed circuit board which is capable of high density packaging in that the multiple number of signal conduction planes make it possible to interconnect a large quantity of electronic components; further, the configuration as to the placement and width of the signal conducting lines or layers in relationship to the spacing or width of the dielectric substance used thus makes it possible to design a configuration which provides an essentially 100 ohm characteristic impedance to all signal lines when they are referenced either to the voltage plane or to the reference plane. Thus, there is a constancy of signal fidelity and an absence of leakage or cross talk.

While the above described embodiments show the specific usage of the invention, it is to be understood that these embodiments are merely illustrative of the various concepts involved in the subject disclosure and are not limited thereby but the invention is deemed to be embracive according to the following claims.

What is claimed is:

1. In a printed circuit board of less than 69 mils overall thickness having six planes of conductive layers wherein each layer is separated by an epoxy glass substrate with a dielectric constant of 4.2–5.0, the combination comprising:
    (a) a central dielectric epoxy glass substrate of 5 mils thickness which is overlaid by an upper central and a lower central conductive copper plane;
    (b) said upper central and said lower central conductive copper planes having a thickness of 1.4 mils and being respectively contiguous to a first internal upper epoxy glass dielectric substrate and a first internal lower epoxy glass dielectric substrate;
    (c) said first internal upper epoxy glass substrate and said first internal lower epoxy glass substrate each having a thickness of 25 mils;
    (d) an upper and a lower internal plane of microstrip transmission lines contiguous to said first internal upper and said first internal lower epoxy glass substrates, said upper and lower internal microstrip transmission lines, each line having a width/thickness ratio of 5 mils/0.7 mil and wherein said upper internal microstrip transmission lines run at right angles to said lower internal microstrip transmission lines;
    (e) a second internal upper and a second internal lower epoxy glass substrate having a 3 mil thickness and resting contiguous to said respective upper and lower internal plane of microstrip transmission lines;
    (f) an upper outer plane of microstrip transmission lines and a lower outer plane of microstrip transmission lines, each line having a width/thickness ratio of 8 mils/1.4 mils, and wherein said upper outer plane and lower outer plane of microstrip transmission lines reside respectively contiguous to said second internal upper and lower epoxy glass substrates, and said upper outer plane of transmission lines run at right angles to said lower outer plane of transmission lines;

(g) a plurality of conductive land areas having central apertures for connection of component leads, said conductive land areas having connection to selected transmission lines and/or said central conductive copper planes;

(h) and wherein the characteristic impedance between any microstrip transmission line and said central conductive copper planes is 100 ohms ±10%.

2. The combination of claim 1 which includes:

(i) a plurality of interconnecting conductive paths transverse to said upper and lower internal and outer planes of microstrip transmission lines, said interconnecting conductive paths providing connection between selected ones of said land areas, of said microstrip transmission lines, and of said upper central and lower central conductive planes.

* * * * *